United States Patent [19]

Estes, Jr.

[11] Patent Number: 5,293,121
[45] Date of Patent: Mar. 8, 1994

[54] ISOLATED CURRENT MONITORING CIRCUIT FOR MEASURING DIRECT AND HIGH DUTY FACTOR CURRENTS

[75] Inventor: Earl M. Estes, Jr., Tucson, Ariz.

[73] Assignee: Hughes Aircraft Company, Los Angeles, Calif.

[21] Appl. No.: 957,964

[22] Filed: Oct. 8, 1992

Related U.S. Application Data

[63] Continuation of Ser. No. 670,664, Mar. 18, 1991, Pat. No. 5,196,784.

[51] Int. Cl.⁵ .................... G01R 33/00; G01R 1/20
[52] U.S. Cl. ................. 324/117 R; 324/127
[58] Field of Search .............. 324/117 R, 127; 307/400, 413; 330/8

[56] References Cited

U.S. PATENT DOCUMENTS

| | | | |
|---|---|---|---|
| 3,136,948 | 6/1964 | Windsor | 324/127 |
| 3,699,442 | 10/1972 | Riley | 324/117 R |
| 3,996,513 | 12/1976 | Butler | 324/127 |
| 4,243,931 | 1/1981 | dela Cruz | 324/117 R |
| 4,274,051 | 6/1981 | Condon | 324/117 R |
| 4,278,938 | 7/1981 | Moriss | 324/117 R |
| 4,298,838 | 11/1981 | Akamatsu et al. | 324/117 R |
| 4,626,777 | 12/1986 | Ainsworth | 324/117 R |
| 5,008,612 | 4/1991 | Otto | 324/117 R |
| 5,128,611 | 7/1992 | Konrad | 324/127 |

Primary Examiner—Ernest F. Karlsen
Attorney, Agent, or Firm—Charles D. Brown; Randall M. Heald; Wanda K. Denson-Low

[57] ABSTRACT

A method and circuit for measuring direct and high duty factor current in a conductor (1) with minimal interference with the operation of a monitored circuit. Current flow in the conductor is magnetically sensed with a transformer T1 having a primary winding connected electrically in series with the conductor (1). The transformer T1 is driven into saturation during a first time interval and brought out of saturation during a second time interval. After the transformer T1 is brought out of saturation, an output signal is provided which is proportional to the flow of current in the conductor (1).

3 Claims, 6 Drawing Sheets

Fig. 6b.  SAMPLE

Fig. 6c.  CHOP

Fig. 6d.  OP AMP OUTPUT

Fig. 6e.  MAGNETIC FLUX

Fig. 6f.  TRANSFORMER SECONDARY VOLTAGE

Fig. 6g.  TRANSFORMER SECONDARY CURRENT

ISOLATED CURRENT MONITORING CIRCUIT FOR MEASURING DIRECT AND HIGH DUTY FACTOR CURRENTS

This is a continuation of application Ser. No. 07/670,664, filed Mar. 18, 1991, now U.S. Pat. No. 5,196,784.

BACKGROUND OF THE INVENTION

1. Field of the Invention

The present invention relates to current monitoring circuits and systems. More specifically, the present invention relates to analog circuits and systems for monitoring current in electrically isolated circuits.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

For many applications, there is a need to determine flow of current in a circuit or conductor. The conventional approach involves the insertion of a series resistor in the conductor. However, the use of a resistor is problematic, lossy and impractical in applications wherein an above-ground voltage is present on the current carrying conductor. More importantly, in some applications, the use of the resistor substantially interferes with the intended operation of the circuit. Hence, for these applications, there is a need for an indirect (or isolated) method for monitoring the current flow in the conductor.

One conventional isolated current monitoring scheme involves use of Hall effect devices. A Hall effect device is a device, which is magnetically coupled to the current carrying conductor. In order to accomplish the required magnetic coupling, the Hall effect device must be placed in series with the magnetic path which encircles the conductor. The Hall effect device has a typical thickness of 0.04 inch. Since the Hall device has magnetic properties similar to those of air, an "air" gap is effectively placed in the magnetic path. The low-permeability gap reduces the overall permeability of the magnetic circuit, to assure that saturation of the magnetic core is avoided. The inductor, thus formed, is effectively inserted in series with the current-carrying conductor of the current monitoring device. For some applications, this added inductance is a circuit parasite capable of storing energy. Most Hall effect devices are prone to relatively large drifts in output when subjected to temperature changes. Complex, and often troublesome, circuitry is frequently required to overcome this temperature drift problem.

Another approach involves the use of a transformer to indirectly sense current flow in the monitored circuit. The transformer provides a coil (typically a single-turn primary) to pick up energy in the magnetic field created by the flow of current through the monitored conductor or circuit.

Transformers are often used for this purpose inasmuch as: 1) the magnetic coupling thereof provides electrical isolation from the circuit being monitored, 2) when large currents are to be measured, the use of a single-turn primary and multi-turn secondary, reduces power loss from the circuit being monitored, and 3) proper choice of the transformer turns ratio provides improved signal-to-noise ratio for increased accuracy and trouble-free operation.

Despite these advantages, conventional transformer based current monitoring circuits cannot be utilized to measure current in DC (direct current) circuits or in those switched circuits that employ duty ratios substantially greater than 50%. This is due to the limitation that transformers fail to function when the magnetic cores thereof are saturated. Hence, conventional transformer based current monitoring circuits provide for a transformer core "reset" during a required OFF portion of every cycle to ensure that the transformer does not "walk" into saturation.

Thus, there is a need in the art for a current monitoring circuit that allows for the measurement of DC and high duty cycle currents without interfering with the operation thereof.

SUMMARY OF THE INVENTION

The need in the art is addressed by the present invention which provides a method and circuit for measuring direct and high duty factor current in a conductor. Current flow in the conductor is magnetically sensed with a transformer having a primary winding connected electrically in series with the conductor. The transformer is driven into saturation during a first time interval and brought out of saturation during a second time interval. After the transformer is brought out of saturation, an output signal is provided which is proportional to the flow of current in the conductor. Measurement of DC and high duty factor currents is effected with minimal interference with the operation of the monitored circuit.

DESCRIPTION OF THE INVENTION

Illustrative embodiments and exemplary applications will now be described with reference to the accompanying drawings to disclose the advantageous teachings of the present invention.

Figures 1A, 1B, 1C, 2A, 2B, 2C:
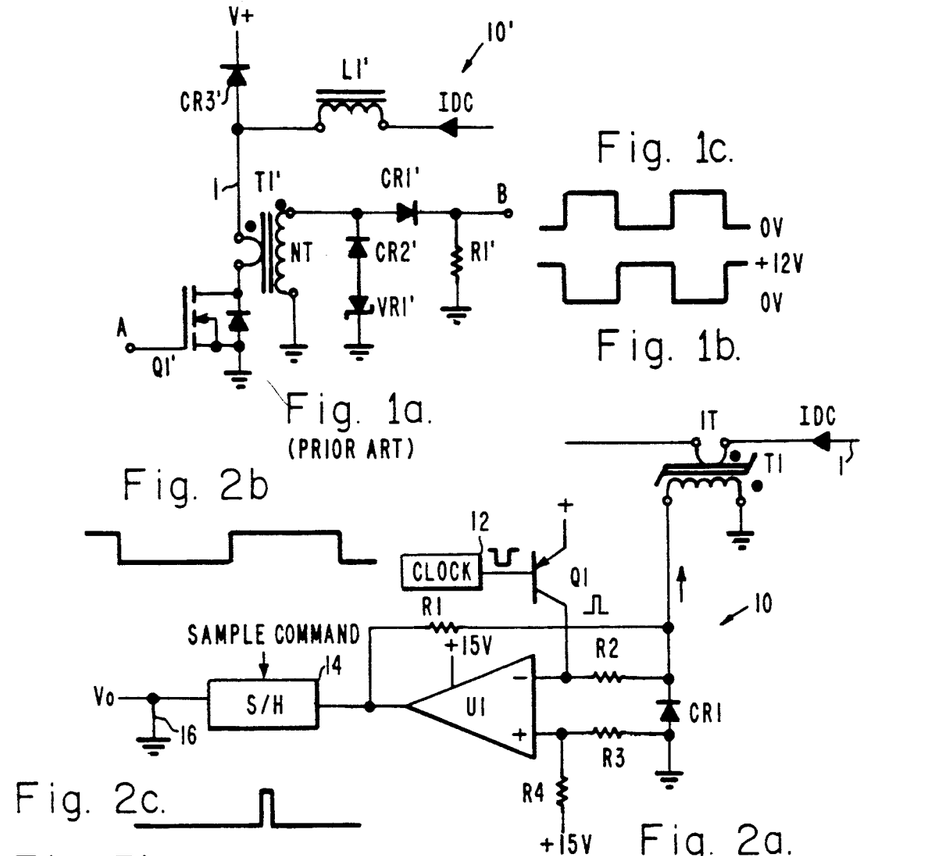
FIG. 1(a) is a schematic diagram of a conventional transformer coupled current monitor.
FIG. 1(b) illustrates a typical control signal applied to the switch Q1' of the conventional current monitoring circuit of FIG. 1(a) at node A.
FIG. 1(c) illustrates a typical output signal provided by the conventional current monitoring circuit of FIG. 1(a) at node B.
FIG. 2(a) is a schematic diagram of a first illustrative embodiment of the current monitoring circuit constructed in accordance with the teachings of the present invention.
FIG. 2(b) is a diagram showing the waveform of the saturate command signal applied to inverting input of the operational amplifier of the current monitoring circuit of FIG. 2(a).
FIG. 2(c) is a diagram showing the waveform of the sample command signal applied to the sample and hold circuit of the current monitoring circuit of FIG. 2(a).

FIG. 1(a) is a schematic diagram of a conventional transformer coupled current monitor 10' capable of measuring current in a switched circuit (not shown) connected via a conductor 1. The primary winding of a current sense transformer T1' is connected in series with a power MOSFET switch Q1'. The switch Q1' (usually part of the circuit being monitored) provides a chopping action that provides an off period in each cycle during which the magnetic flux in the core of the transformer T1' is allowed to reset to near zero. During the off period of the switch, the minute magnetizing current that has accumulated in the current sense transformer T1' during the on period is allowed to "dump" into zener diode VR1' via diode CR2. The magnetic core of the current sense transformer is thereby prevented from walking into saturation. When MOSFET Q1' conducts, a current is induced in the secondary winding of transformer T1' that is in direct proportion to that in the primary. This current flows from the secondary through diode CR1', resistor R1' and returns to the secondary via ground. This produces a voltage across R1' that is directly related to the current in the primary. Diodes CR1' and CR2' thus steer the secondary current to R1' and VR1' respectively during the appropriate portions of the cycle.

FIG. 1(b) illustrates a control signal applied to the switch Q1' at node A. FIG. 1(c) illustrates a typical output signal provided by the conventional current monitoring circuit of FIG. 1(a) at node B.

Although useful for some applications, this technique is not capable of measuring direct current since the switch duty factor can not approach 100% without causing the transformer core to saturate. This shortcoming is addressed by the present invention which provides a chopping technique that enables the circuit to monitor direct current. The technique of the present invention involves deliberate saturation of the core during a portion of the cycle in order to ensure that the core will not be in saturation at the time when a data sample is to be captured.

FIG. 2(a) is a schematic diagram of a first illustrative embodiment of the current monitoring circuit 10 constructed in accordance with the teachings of the present invention. In the first illustrative embodiment, the circuit invention 10 includes a transformer T1. The transformer core is typically a tape wound core made of very high permeability magnetic material, of a type that has a very square hysteresis loop to provide rapid saturation and de-saturation at the ends of the hysteresis cycle. Examples of such magnetic materials are square Permaloy-80 manufactured by Magnetics Inc. of Butler, Pa. Also, certain rare earth materials could be used such as Metglass, manufactured by Allied Chemical Corporation. ("Metglass" is a registered trademark of Allied Chemical Corporation.) The tape thickness is typically 1 mil. (0.001 inch) or less. The transformer T1 has a one turn primary winding connected in series with the conductor 1 from a monitored circuit (not shown). One end of the secondary winding of the transformer T1 is connected to a circuit for driving the transformer into saturation and bringing the transformer out of saturation (as discussed more fully below), while the second end of the secondary winding is connected to a potential well (or ground). The first end of the secondary winding of the transformer is connected to a node at which one end of first and second resistors R1 and R2 are connected to the cathode of a first diode CR1. The second end of the second resistor R2 is connected to an inverting input of an operational amplifier U1 and the second end of the first resistor R1 is connected to the output of the operational amplifier. A third resistor is connected between the noninverting input of the operational amplifier U1 and the anode of the first diode CR1. A fourth resistor is connected between the noninverting input of the operational amplifier U1 and a source of positive supply voltage. The collector of a first (bipolar PNP) transistor Q1 is also connected to the inverting input of the operational amplifier U1. A clock signal is applied to the base of the first transistor Q1 by the clock 12. The emitter of the first transistor Q1 is connected to a source of positive bias voltage. The output of the operational amplifier U1 is connected to a sample and hold circuit 14.

In operation, the clock 12 applies a saturate command to the base of the first transistor Q1. When the saturate command signal goes low, the transistor Q1 conducts and places a high at the inverting input of the operational amplifier U1. FIG. 2(b) is a diagram showing the waveform of the saturate command signal applied to the inverting input of the operational amplifier of the current monitoring circuit of FIG. 2(a). The chopping waveform, typically having 50% duty cycle, is applied to the secondary of the current monitoring transformer T1, and consists of the following two states:

1) During state 1, the voltage applied to the transformer secondary winding is of the same polarity as the minute voltage impressed across the primary by the current being monitored. By assuring that the volt-second product of this portion of the cycle is greater than that of state 2, the magnetic core is forced into saturation. This establishes a known baseline condition, which ensures that the core cannot be driven to saturation in the opposite sense before the data is to be sampled. The choice of a core material that saturates abruptly offers the advantage that when the applied voltage is reversed, it also unsaturates abruptly, i.e., the current sensing transformer T1 quickly returns to a linear operating state.

2) The turn-off of Q1 initiates state 2, during which the chopping voltage applied to the secondary is reversed from that of state 1, i.e., it bucks and overrides the voltage produced by the current flowing in the primary. Due to the squareness in the hysteresis loop material employed, the core is quickly returned to an unsaturated state by this reversed voltage. The transformer T1 then functions as a linear current transformer for the remainder of state 2. The secondary winding current is converted to a voltage and sampled in synchronism with the chopping input. Such a circuit typically consists of an operational amplifier and a sample and hold integrated circuit. At the time the data samples are captured by the sample and hold circuit, the secondary current is 1/N times the primary current, where N is the ratio of secondary turns to primary turns. The gain of the circuit is controlled by the turns ratio of the transformer and the choice of feedback resistor employed with the operational amplifier.

Turn-on of Q1 causes the signal at the inverting input to exceed that at the noninverting input (e.g., 1 volt), the output of the operational amplifier U1 goes low. With the operational amplifier U1 thus held in an open loop state, the current flowing in the secondary of the transformer T1 flows through the first diode CR1. This is a return to saturation period during which the voltage at the ungrounded end of the secondary winding is approximately −0.7 volts as determined by the drop across the first diode CR1. With a transformer turns ratio of 500:1, R1 equal to 100 ohms, R2 and R3 equal to 4.02 K ohms each, R4 equal to 56.2 K ohms and bias and supply voltages of +15 volts applied to the operational amplifier U1 and 15 volts applied to the fourth resistor R4, the voltage across the single turn primary of T1 is less than 2 millivolts. After a short period, perhaps a few microseconds, the first transformer T1 returns to its saturated state and the voltage drop thereacross drops to zero where it remains until the next state 2 command.

State 2 is initiated by turning Q1 off. This allows the voltage on the cathode of the first diode CR1 to be delivered to the operational amplifier U1 via the second resistor R2 and permits the amplifier loop to close. The voltage on the output of the operational amplifier U1 rises to a level that causes the current in the secondary of the transformer T1 to be delivered via the first resistor R1 from the output of the operational amplifier U1. With the illustrative values set forth above, the voltage across the secondary of the transformer T1 will now be at 1 volt as it is forced to match the 1 volt bias potential applied to the noninverting input of the operational amplifier U1. This voltage reversal on the secondary of the transformer T1 causes the very square hysteresis core of the transformer T1 to unsaturate quickly (e.g., in a microsecond). As soon as the core unsaturates, the voltage at the output of the operational amplifier U1 is:

$$V_{out} = V_B + R1 \cdot I/N \quad [1]$$

where I is the current being monitored in the conductor 1, N is the transformer turns ratio, and $V_B$ is the bias voltage applied to the noninverting input to the operational amplifier. This current monitor output pulse is then synchronously captured by a sample and hold circuit 14 or an A/D converter (not shown). FIG. 2(c) shows a waveform that would be applied to the sample and hold circuit 14 to time the operation thereof. FIGS. 2(b) and 2(c) are in temporal alignment such that it is apparent that the sample pulse occurs just before the re-saturate signal goes high.

Thus, the four part cycle of the present invention is 1) re-saturate, 2) rest in a saturated state, 3) unsaturate/-linearize, and 4) sample.

Figures 3A, 3B, 3C:
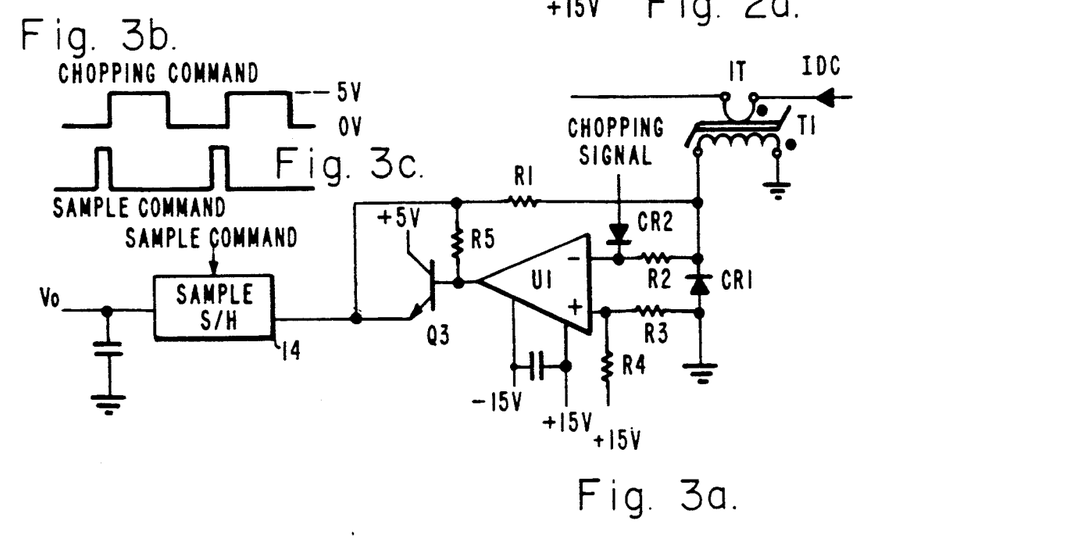
FIG. 3(a) is a first alternative embodiment of the current monitoring circuit of the present invention.
FIG. 3(b) is a diagram showing the waveform of the saturate command signal applied to the inverting input of the operational amplifier of the current monitoring circuit of FIG. 3(a).
FIG. 3(c) shows a waveform that would be applied to the sample and hold circuit of the current monitoring circuit of the present invention to time the operation thereof.

FIG. 3(a) is a first alternative embodiment of the current monitoring circuit of the present invention. This embodiment is essentially the same as that of FIG. 2(a) with the exception that the transistor Q1 is replaced by a second diode CR2, a buffer amplifier is provided by a third transistor Q3 and a fifth resistor R5 is added between the base and the emitter of the third transistor Q3. In addition, a capacitor is provided between the bias supplies. The input signal is again of the form shown in FIG. 2(b) while the sample signal is as shown in FIG. 2(c).

In operation, a logic level chopping command is applied to the anode of diode, CR2. FIG. 3(b) is a diagram showing the waveform of the saturate command signal applied to the inverting input of the operational amplifier of the current monitoring circuit of FIG. 3(a). The chopping waveform, typically having a 50% duty cycle, is applied to the secondary of the current monitoring transformer T1 and consists of the following 2 states:

1) During state 1, the voltage applied to the transformer secondary winding is of the same polarity as the minute voltage impressed across the primary by the current being monitored. By assuring that the volt-second product of this portion of the cycle is greater than that of state 2, the magnetic core is forced into saturation. This establishes a known baseline condition, which ensures that the core cannot be driven to saturation in the opposite sense before the data is to be sampled. The choice of a core material that saturates abruptly offers the advantage that when the applied voltage is reversed, it also unsaturates abruptly, i.e., the current sensing transformer T1 quickly returns to a linear operating state.

When the chopping command signal transfers to its low state the operational amplifier unsaturates, i.e., it is permitted to return to linear operation. The output of the operational amplifier and its current buffer, transistor Q3, supply a small voltage, 1 Volt, to the secondary of transformer, T1, via resistor, R1. This voltage is of a polarity that bucks the voltage applied to the primary by the current to be measured. Due to the squareness in the hysteresis loop material employed, the core is quickly returned to an unsaturated state by this reversed voltage. The transformer T1 then functions as a linear current transformer for the remainder of state 2. The secondary winding current is converted to a voltage and sampled in synchronism with the chopping input. Such a circuit typically consists of an operational amplifier and a sample and hold integrated circuit or D/A converter. At the time the data samples are captured by the sample and hold circuit, the secondary current is 1/N times the primary current, where N is the ratio of secondary turns to primary turns. The gain of the circuit is controlled by the turns ratio of the transformer and the choice of feedback resistor employed with the operational amplifier.

When the high state of the chopping command is applied to the anode of diode, CR2, the signal at the inverting input exceeds that at the noninverting input (e.g., 1 volt), which causes the output of the operational amplifier U1 to go low. With the operational amplifier U1 thus held in an open loop state, the current flowing in the secondary of the transformer T1 flows through the first diode CR1. This is a return to saturation period during which the voltage at the ungrounded end of the secondary winding is approximately −0.7 volts as determined by the drop across the first diode CR1. With a transformer turns ratio of 500:1, R1 equal to 50.0 ohms, R1 equal to 50.0 ohms, R2 and R3 equal to 4.02 K ohms each, R4 equal to 56.2 K ohms, and bias and supply voltages of + and −15 volts applied to the operational amplifier U1 and 15 volts applied to resistor R4, the voltage across the single turn primary of T1 should be less than 2 millivolts. After a short period, perhaps a few microseconds, the first transformer T1 returns to its saturated state and the voltage drop thereacross drops to zero where it remains until the next state 2 command.

State 2 is initiated when the steering signal applied to the anode of diode CR2 goes low. This allows the voltage on the cathode of diode CR1 to be delivered to the operational amplifier U1 via resistor R2 and permits the amplifier loop to close. The voltage on the output of the operational amplifier U1 rises to a level that causes the current in the secondary of the transformer T1 to be delivered via resistor R1 from the output of the operational amplifier U1 and current buffer Q3. With the illustrative values set forth above, the voltage across the secondary of the transformer T1 will now be at 1 volt as it is forced to match the 1 volt bias potential applied to the noninverting input of the operational amplifier U1. This voltage reversal on the secondary of the transformer T1 causes the very square hysteresis core of the transformer T1 to unsaturate quickly (e.g., in a microsecond). As soon as the core unsaturates, the voltage at the output of the operational amplifier U1 is:

$$V_{out} = V_B + R1 \cdot I/N \quad [2]$$

where I is the current being monitored in the conductor 1, N is the transformer turns ratio, and $V_B$ is the bias voltage applied to the noninverting input to the operational amplifier. This current monitor output pulse is then synchronously captured by a sample and hold circuit 14 or an A/D converter (not shown).

FIG. 3(c) shows a waveform that would be applied to the sample and hold circuit 14 to time the operation thereof. FIGS. 3(b) and 3(c) are in temporal alignment such that it is apparent that the sample pulse occurs just before the re-saturate signal goes high.

Figures 4A, 4B, 4C:
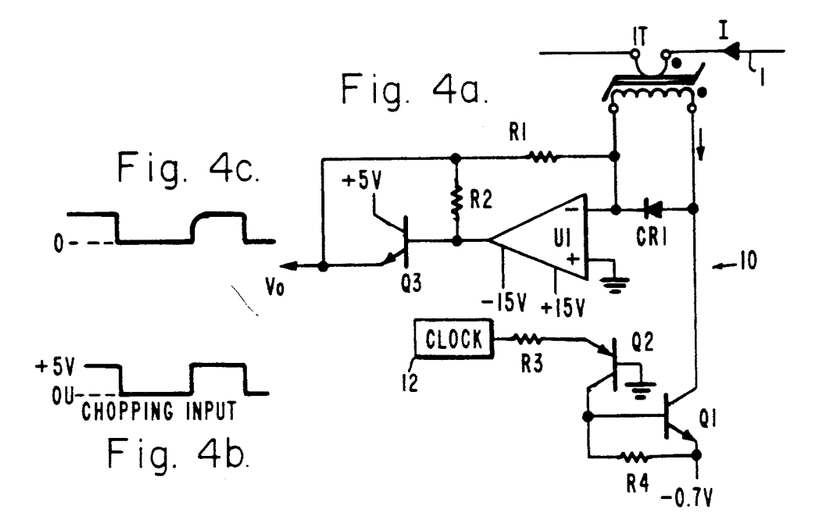
FIG. 4(a) is a second alternative embodiment of the current monitoring circuit of the present invention.
FIG. 4(b) is a diagram showing the waveform of the saturation command signal applied to the secondary winding of the transformer of the current monitoring circuit of FIG. 4(a).
FIG. 4(c) is a diagram of the output of the current monitoring circuit of FIG. 4(a).

FIG. 4(a) is a second alternative embodiment of the current monitoring circuit of the present invention. In the embodiment of FIG. 4(a), the noninverting input of the operational amplifier U1 is connected to a ground reference and the inverting input is connected to the one end of the secondary winding of the transformer T1. The second end of the secondary winding of the transformer is connected to the collector of a first (bipolar NPN) transistor Q1. The emitter of the first transistor is connected to a −0.7 volt supply. The base of the first transistor Q1 is connected to the collector of a second transistor Q2. In the illustrative embodiment of FIG. 4(a), the second transistor Q2 is a PNP bipolar transistor. The base terminal of the second transistor is connected to ground.

The anode of a first diode CR1 is connected to the collector of the first transistor Q1 while the cathode of same is connected to the inverting input of the operational amplifier U1. Thus, the first diode is connected between the ends of the secondary winding of the transformer I1. A first resistor is also connected at one end to the inverting input of operational amplifier U1. A second resistor is connected at one end to the output of the operational amplifier U1. The output of the operational amplifier U1 is connected to the base of a third bipolar transistor Q3. The third transistor Q3 is a bipolar NPN transistor in the illustrative embodiment of FIG. 4(a). The collector terminal of the third transistor Q3 is connected to a source of a 5 volt supply. The emitter of the third transistor Q3 is connected to the second ends of the first and second resistors R1 and R2 and provides the output of the current monitoring circuit 10.

A chopping input saturation signal, such as that illustrated in FIG. 4(b), is applied to the transformer T1 through a third resistor R3, the emitter collector junction of the second transistor Q2 and the first transistor Q1.

The operation of the embodiment of FIG. 4(a) is essentially the same as that of the embodiment of FIG. 2(a). The transistor Q2 serves to provide a threshold for the activation of the first transistor Q1. The third transistor Q3 buffers the output of the operational amplifier U1 and thereby provides increased current drive for the output therefrom. The output of this circuit is depicted in FIG. 4(c) for an input signal of the form shown in FIG. 4(b).

In this circuit the operational amplifier U1 and its current buffer transistor Q3 function only as a current to voltage converter, with the chopping action being performed by first and second transistors Q1 and Q2. This eliminates the voltage pedestal from the output, so that the output is referenced to ground instead of 1 volt. In this third embodiment, the operational amplifier U1 remains linear throughout the entire cycle, i.e., a virtual ground is maintained on the cathode of first diode CR1 throughout states 1 and 2. When the chopping signal supplied to third resistor R3 goes low the second and first transistors Q2 and Q1 cease conducting to initiate state 1. Current I flowing through the single-turn primary of transformer T1 induces a positive voltage on the anode of CR1, causing CR1 to conduct. This current path is from the secondary of T1 through CR1 and return to the secondary of T1. The voltage developed across the secondary is limited by CR1 to approximately 0.7 volts and the voltage across the primary is thus limited to 0.7/N=1.4 millivolts. This voltage causes the transformer to return to saturation. When the transformer saturates the voltage across it drops to near zero where it remains for the balance of state 1.

State 2 is initiated when the clock/steering signal applied to third resistor R3 goes high. This causes current to flow through third resistor R3, second transistor Q2, and the emitter-base junction of the first transistor Q1, causing Q1 to conduct. The conduction of Q1 applies approximately −0.5 volts to the anode of first diode CR1 and the secondary winding of transformer T1. This voltage is of a polarity that bucks the voltage induced into T1 by the current I through the primary, and is opposite the polarity applied to the transformer during state 1. This reversed voltage causes the square hysteresis loop core of the transformer to quickly unsaturate, returning it to a linear operating state. In this linear operating state current flows from operational amplifier U1 and its buffer transistor Q3 through first resistor R1, the secondary of transformer T1, collector to emitter of the first transistor Q1 to the −0.7 volt supply. Since the current through R1 is identically the same as the current through the transformer secondary, and since one end of R1 is at virtual ground, the voltage $V_{Q3}$ at the emitter of Q3 is:

$$V_{Q3} = I*R1*1/N \qquad [3]$$

Where: R1 is the resistance of R1 in ohms and N is the transformer turns ratio. In the example of FIG. 4(a) the voltage output is 0.2*I or 200 mv/amp. In most applications this output voltage would be sampled with a sample and hold integrated circuit or D/A converter near the end of state 2. State 2 ends when the clock signal goes low, and the cycle repeats.

FIG. 5 (a) shows a third alternative embodiment of the current monitoring circuit 10 of the present invention. FIGS. 5(b), 5(c) and 5(d) respectively illustrate the waveforms which appear at the output of the pulse width modulator U1, the three microsecond ONE SHOT U3, and the collector of Q1 in their proper time relationships to each other. This invention is utilized in a buck converter to provide current feedback to the pulse width modulator, without the restriction that switch duty factor cannot approach 100%. A secondary advantage of this configuration is that the minute inductance introduced into the circuit by the current monitor is not in series with the MOSFET switch. This helps to reduce the voltage spiking at the drain of Q3 when it turns off. This circuit provides near-elimination of duty cycle restriction to realize increased efficiency and improved tolerance to low input line voltage conditions. An integrated circuit could be produced that would combine the functions of U1 and U3 into advanced configuration that would remove all restriction from duty cycle. The result would be a slight additional improvement in dynamic range.

Figure 5A:
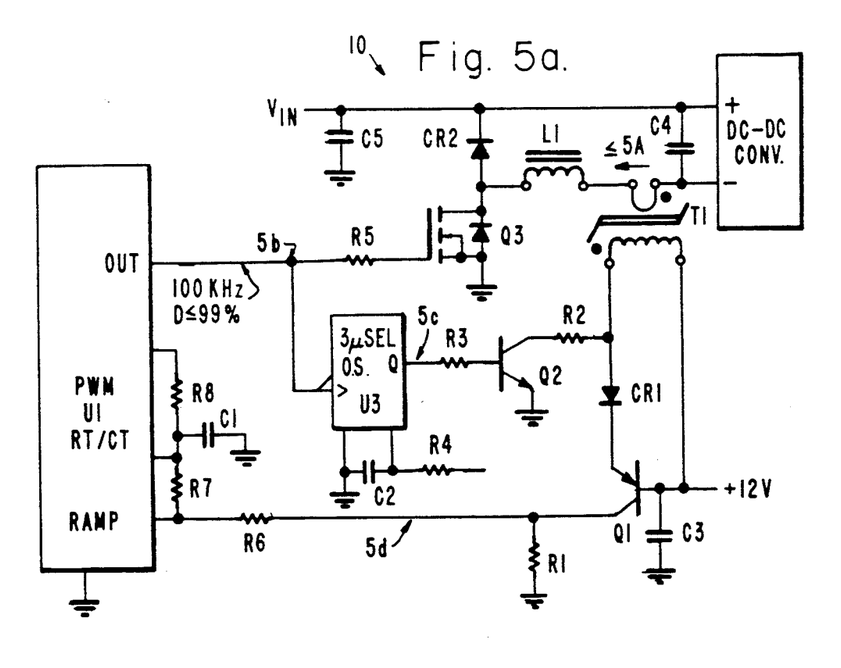
FIG. 5(a) a third alternative embodiment of the current monitoring circuit 10 of the present invention.

In operation, the output signal from U1, the pulse width modulator IC controls MOSFET Q3 and ONE SHOT IC U3. When Q3 turns off U3 is triggered, causing it to activate RESET transistor Q2. When Q2 is conducting, current flows from the +12 Volt housekeeping power supply through the secondary of current sense transformer T1, resistor R2, transistor Q2, and returns to the +12 Volt power supply via ground. The voltage impressed across the secondary of T1 is of the same polarity as that produced by the current to be monitored, which flows in the single-turn primary. This voltage causes T1 to saturate within the three microsecond period allocated by ONE SHOT U3. State 2 begins when Q2 is turned off by U1 at the end of the three microsecond reset (state 1) interval. During state 2 the current flowing in the single-turn primary of T1 causes a corresponding current, $I_{PRI}/N$, to flow in the secondary. This current path is from the +12 Volt power supply through the secondary of T1, diode CR1, transistor Q1, resistor R1, and return to the power supply via ground. This current, flowing through resistor R1, produces an analog feedback which is in proportion to the current to be monitored. This voltage is supplied to the RAMP input to U1 via resistor R6.

Figure 5B:
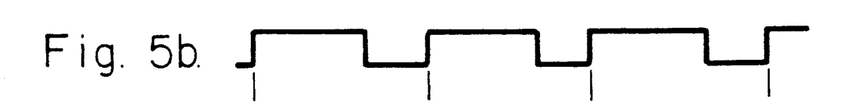
FIG. 5(b) shows the waveform that appears at the output of the pulse width modulator IC employed in FIG. 5(a).
Figure 5C:
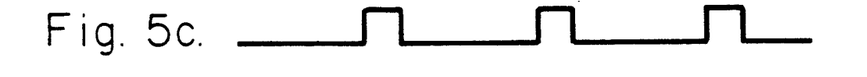
FIG. 5(c) shows the saturation command signal that is generated by the one shot employed in FIG. 5(a).
Figure 5D:
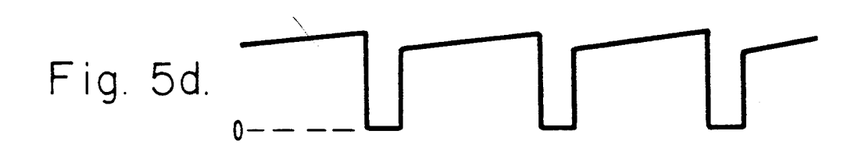
FIG. 5(d) shows the analog of the current being monitored.

The waveforms of FIGS. 5(a), 5(b), and 5(c) appear at the respective points indicated in FIG. 5. Resistive divider R7/(R7+R6) adds slope compensation to this current analog. Slope compensation is required in current programmed buck converters operating in continuous inductor conduction mode with greater than 50% duty factor. This circuit thus employs the saturating transformer current monitoring principle of the present invention to monitor inductor current with no significant limitation on duty cycle. A secondary advantage is that the free wheeling rectifier recovery current spike does not pass through the saturable transformer T1, thus eliminating the requirement for spike suppression circuitry.

The DC-DC converter used in this embodiment is shown only as a block, which would be a typical load for the buck regulator. Resistor R8 and capacitor C1 are generic, as required to determine the operating frequency. Capacitors C3, C4, and C5 are typical high Q bypass capacitors. In the illustrative embodiment, resistor R5 is 15 ohms, resistor R3 is 5 K ohms, transistor Q1 is a 2N2907, transistor Q2 is a 2N2222, MOSFET Q3 is a type IRF350, diode CR1 is a 1N4150, diode CR4 is a type UES804, inductor L1 is 400 microhenries, 10 Amp., and the pulse width modulator, U1, is a type UC1842 integrated circuit.

Figure 6A:
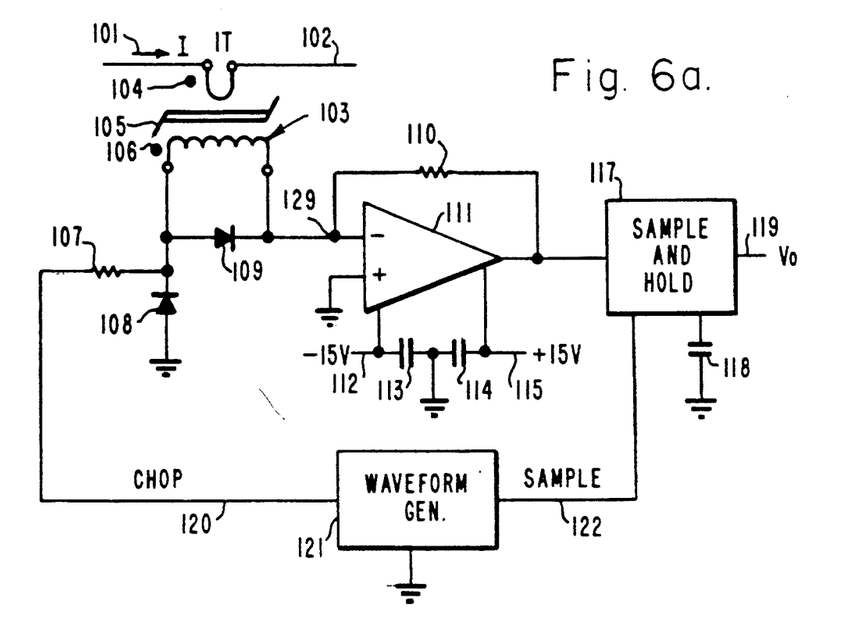
FIG. 6(a) a fourth alternative embodiment of the current monitoring circuit of the present invention.
Figure 6B:
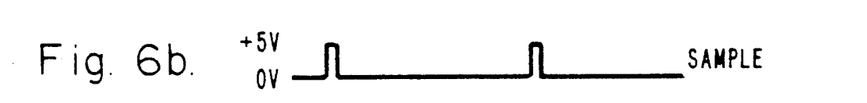
FIG. 6(b) shows the waveform of the sample signal applied to the current monitoring circuit of FIG. 6(a).
Figure 6C:
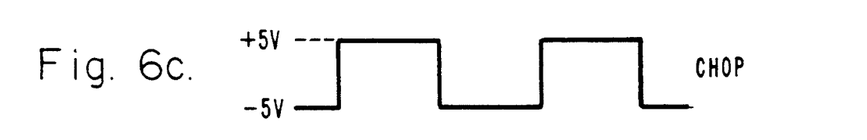
FIG. 6(c) shows the waveform of the saturation signal applied to the current monitoring circuit of FIG. 6(a).
Figure 6D:
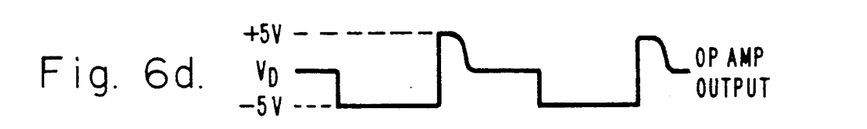
FIG. 6(d) shows the waveform of the output of the operational amplifier of the current monitoring circuit of FIG. 6(a).
Figure 6E:
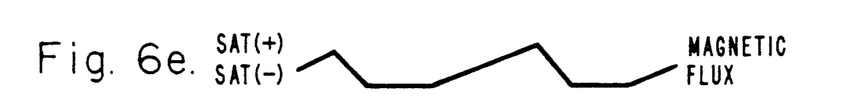
FIG. 6(e) shows the waveform of the magnetic flux of the transformer of the current monitoring circuit of FIG. 6(a).
Figure 6F:
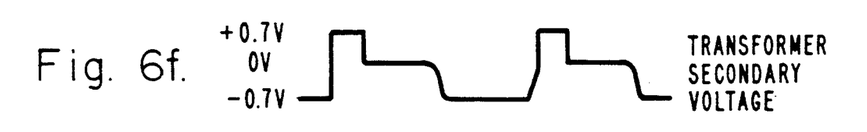
FIG. 6(f) shows the waveform of the voltage on the secondary winding of the transformer of the current monitoring circuit of FIG. 6(a).
Figure 6G:
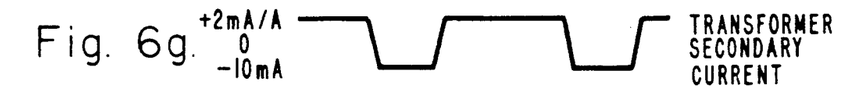
FIG. 6(g) shows the waveform of the current through the secondary winding of the transformer of the current monitoring circuit of FIG. 6(a).

FIG. 6(a) shows a fourth alternative embodiment of the current monitoring circuit of the present invention. FIG. 6(b) shows the waveform of the sample signal applied to the current monitoring circuit of FIG. 6(a). FIG. 6(c) shows the waveform of the saturation signal applied to the current monitoring circuit of FIG. 6(a). FIG. 6(d) shows the waveform of the output of the operational amplifier of the current monitoring circuit of FIG. 6(a). FIG. 6(e) shows the waveform of the magnetic flux of the transformer of the current monitoring circuit of FIG. 6(a). FIG. 6(f) shows the waveform of the voltage on the secondary winding of the transformer of the current monitoring circuit of FIG. 6(a). FIG. 6(g) shows the waveform of the current through the secondary winding of the transformer of the current monitoring circuit of FIG. 6(a).

In FIG. 6(a), direct current flows in monitored conductor 102 and the single-turn primary 104 of the transformer 103 producing a minute voltage across the primary that is positive at the end marked with a polarity dot. A waveform generator 121 applies the chopping waveform of FIG. 6(b) to a resistor 107. During state 1, this input to the resistor 107 is in its high state. At the beginning of state 1, there are two significant current flow paths on the secondary side of the transformer. The first is from waveform generator 121 through resistor 107, diode 109, resistor 110, operational amplifier 111, and return to ground via the negative supply 112. The second current path is from the secondary 106 of the transformer 103 through a diode 109 and return to secondary 106. The voltage across the secondary 106 of the transformer 103 produced by the above-described currents flowing through diode 109 is of such a polarity that it causes the magnetic flux in core 105 to return to saturation. See the magnetic flux waveform of FIG. 6(e). When the transformer 103 saturates, it becomes an effective short circuit across the diode 109. For the remainder of state 1, current flows from the waveform generator 121, resistor 107, secondary 106 of the transformer 103, resistor 110, operational amplifier 111, and returns to ground via the negative supply 112.

At the beginning of state 2, chopping waveform from the waveform generator 121 switches to its low state causing the diode 108 to start conducting. Current then begins to flow from the positive supply 115 through operational amplifier 111, resistor 110, secondary 106 of the transformer 103, and resistor 107 and returns to ground via waveform generator 121. The voltage across the secondary 106 of the transformer 103 is thus reversed and held at 0.7 volts, by the forward conduction potential of diode 108. This voltage is of a polarity that opposes the voltage induced by current I flowing in the primary. After a short time, less than a millisecond, transformer core 105 is restored to its unsaturated condition, so that the transformer 103 functions as a linear current transformer for the remainder of state 2.

During this latter portion of state 2, when the transformer 103 is functioning as a linear current transformer, the input 116 to the sample and hold circuit 117 is 1 volt/amp times the current I. This is determined by the turns ratio of the transformer 103 and resistor 110. With the illustrative component values shown, each ampere flowing in the primary 104 of the transformer 103 causes 1/500 ampere to flow in the secondary 106. This current 2 ma/amp flows through the resistor 110 dropping 1 volt/amp thereacross. Since one end of resistor 110 is at virtual ground at node 129, the output of the operational amplifier 111 is identically 1 volt/amp. During this latter portion of state 2, when the output of the operational amplifier 111 has settled at a voltage proportional to the current in conductor 102, waveform generator 121 supplies a sample command to sample and hold circuit 117 to update output 119. Capacitor 118 holds this voltage until the next update event.

The transformer 103 used in this embodiment was constructed as follows. The core is part #80512-1/2 D MA supplied by Magnetics Inc., of Butler, Pa. This standard catalog item is a miniature tape wound toroid, 0.350 inch diameter and 0.105 inch thick. The tape employed in the manufacture of the core was 0.5 mil (0.0005 inch) thick Square Permalloy 80, which is an 80% nickel-iron Ni-Fe alloy. The secondary is 500 turns of AWG 36 magnet wire. The single-turn primary consists of the current-carrying AWG-18 wire passing through the center of the toroid. Diodes 108 and 109 are 1N4150. Resistors 107 and 110 are 500 ohm ¼ watt. Operational amplifier 111 is one-half a TLO-72. Capacitors 113 and 114 are 0.1 microfarad, 100 volt, ceramic. The waveform generator 121 and the sample and hold circuit 117 were shown simplified in FIG. 6(a) for the purpose of illustration.

Figures 7A, 7B:
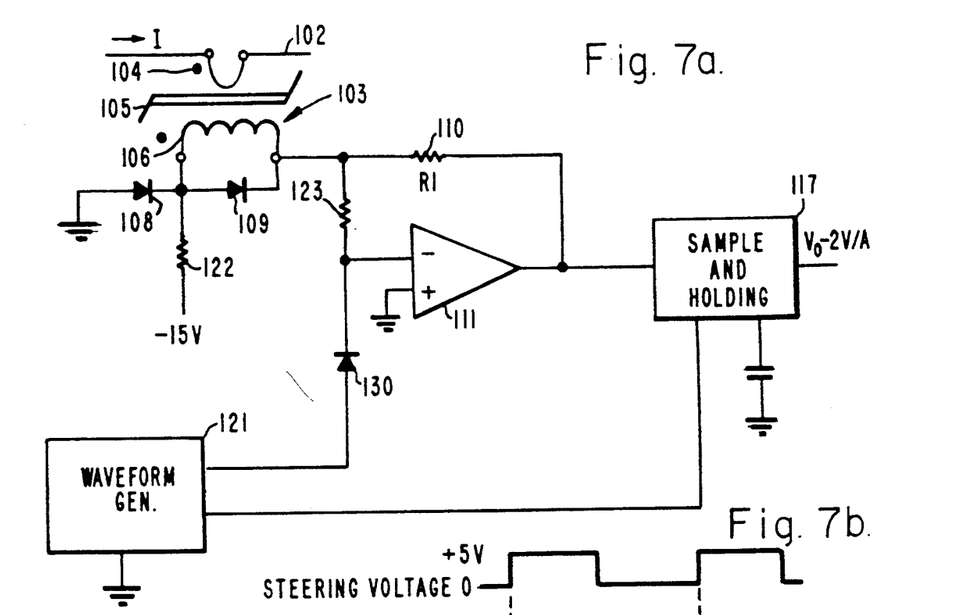
FIG. 7(a) shows a fifth alternative embodiment of the current monitoring circuit of the present invention.
FIGS. 7(b) and 7(c) the waveforms at the input and the output, respectively, of the waveform generator of the current monitoring circuit of the present invention.

FIG. 7a shows a fifth alternative embodiment similar to that of FIG. 6(a) with the exception that the reset and linearize voltages are applied to the secondary of the saturable transformer in a somewhat different manner. In operation, state 1 is initiated when the steering voltage output from wave form generator 121, goes high. Current then flows from the waveform generator through diode 130, and forces the inverting input to operational amplifier 111, to go positive, with the result that the operational amplifier output saturates in a negative direction. This establishes a current path from ground through diodes 108 and 109, resistor 110, operational amplifier 111, and returns to ground via the negative supply, not shown. Two other current paths flow through resistors 122 and 123, but they are not important during state 1. The current flowing through diode 109, impresses a voltage across secondary 106, of saturable transformer core 105 of transformer 103. This 0.7 volts is of the same polarity as that prod by the current I, which flows through the single-turn primary. After a short time, a millisecond or so, the transformer is returned to saturation. The current previously flowing through diode 109 is then diverted through the secondary, since a transformer in saturation is essentially a short circuit. The transformer remains in saturation throughout the remainder of state 1.

State 2 is initiated when the steering output from waveform generator goes low, causing diode 130 to stop conducting. Current now flows from the positive supply, not shown, through operational amplifier 111, resistor 110, the secondary 106, of transformer 103, resistor 122, the negative supply, not shown, and returns to the positive supply via ground. A second current path flows from ground through diode 108, resistor 122, and returns to ground via the negative supply. This applies $-0.7$ volts to the end of the secondary that is marked with a polarity dot, and the operational amplifier applies virtual ground to the opposite end of the secondary. The result is a small voltage 0.7 volts, across the secondary that is of a polarity that bucks the voltage impressed across the single-turn primary by current I. After a short time, less than a millisecond, the transformer is returned from its saturated state to its linear operating state, at which time it begins to function as a linear current transformer. A current path is then caused to flow from the positive supply via operational amplifier 111, resistor 110, secondary 106, resistor 122, the negative supply, and returns to the positive supply via ground. Since one end of resistor 110 is at virtual ground, the output of operational amplifier 111 is seen to be at:

$$V_o = I*R1/N. \qquad [4]$$

Figures 7C, 9:
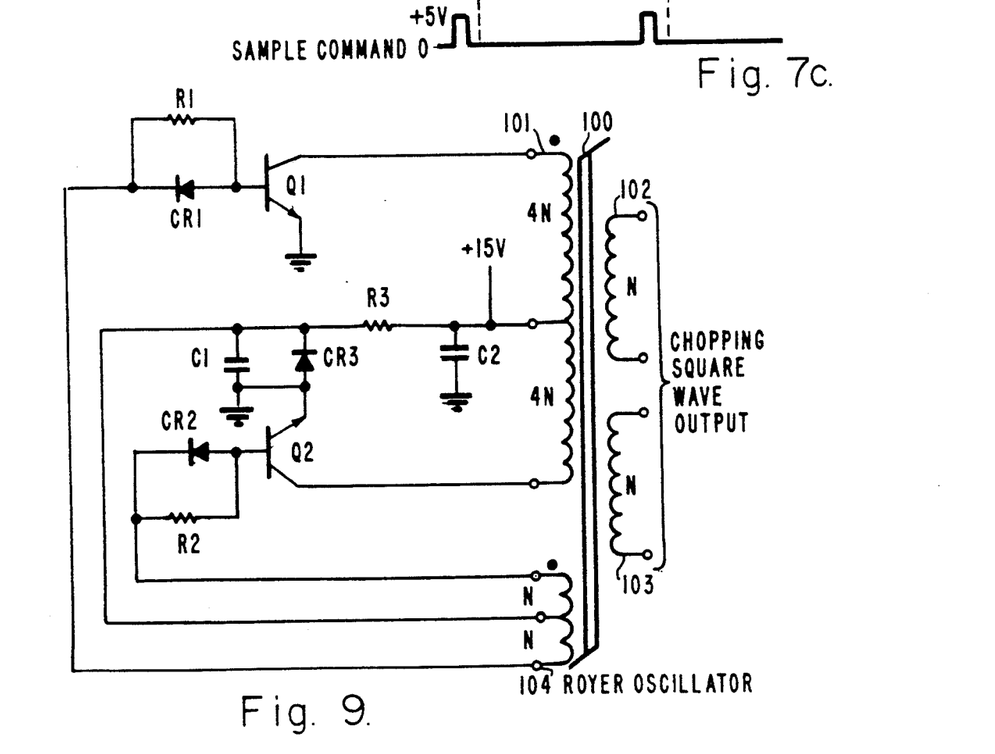
FIG. 9 is an illustrative embodiment of the Royer oscillator employed in the current monitor of FIG. 8.

This voltage is sampled near the end of state 2, in response to the SAMPLE command FIG. 7(c). The sampling device can be either a sample and hold IC, shown, or an A/D converter, not shown. For the parameters shown the output is 2 Volts per Ampere.

The components used in this embodiment are essentially the same as those used in the previously described embodiments. The diodes are 1N4150, transformer 103 is identical to the one described for FIG. 2(a). Resistors 110 and 122 are 1.0 K ohm, ¼ watt and resistor 123 is 2.0 K ohm, ¼ watt. Operational amplifier 111, is one-half a TLO-72. The waveform generator and the sample and hold integrated circuit are generic devices.

Figure 8:
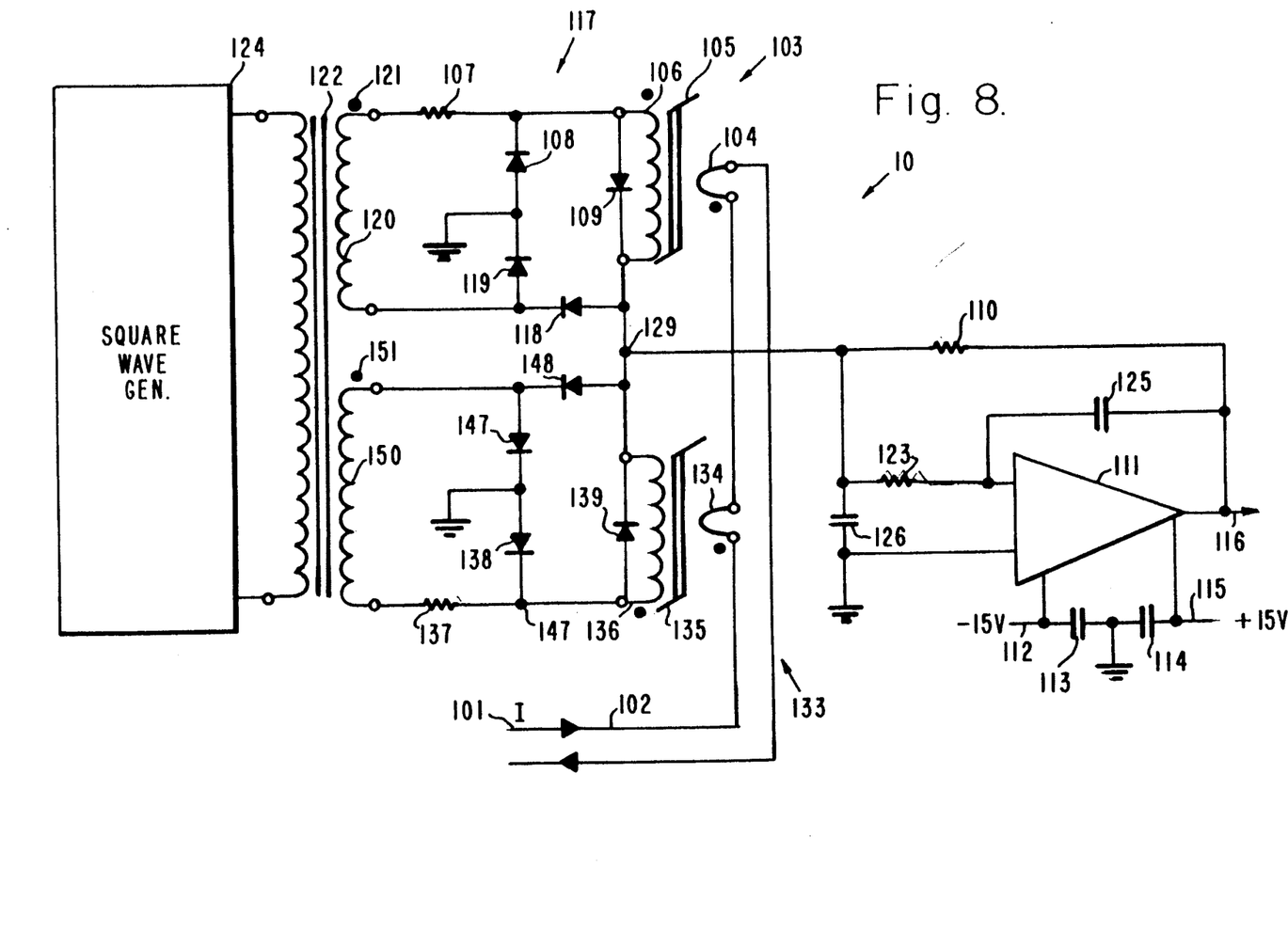
FIG. 8 shows a sixth alternative embodiment of the current monitoring circuit of the present invention.

FIG. 8 shows a sixth alternative embodiment of the present invention. This tandem embodiment is capable of supplying an essentially continuous output that is proportional to the DC current to be monitored. In brief, the transformer 122 is part of a square wave generator 124 which could consist of a Royer oscillator as shown in FIG. 9, or a Jensen oscillator.

Although not part of the invention, the functioning of the Royer oscillator of FIG. 9 is described for clarity as follows: Transformer 100 is constructed with a saturable core made of the same or similar square hysteresis loop material as that used in the current monitor transformers of the current invention. When 15 volt power is applied, current initially flows through R3, tertiary winding 102, resistors R1 and R2, and base to emitter in both transistors Q1 and Q2. This starts to turn both transistors on, but one will always prevail over the other causing the one to saturate and the other to turn off. Assume that Q2 prevails over Q1 initially. The conduction of Q2 causes the non polarity dot end of winding 101 of saturable transformer 100 to be clamped to the ground potential. Transformer action then causes the non polarity dot end of tertiary winding 104 to go negative which turns Q2 off and the polarity dot end of tertiary winding 104 to go positive, reinforcing the turn-on of Q2. This conduction-sustaining current path is from the polarity dot end of tertiary winding 104 through resistor R2, base to emitter of Q2, ground, CR3, and return to the center tap of tertiary winding 104. Resistor R3 is used only to provide a "tickle" of startup bias current. After startup a potential of minus 0.7 volts is maintained at the cathode of diode CR3. During this half of the cycle the base of Q1 is held approximately 4 volts negative, which maintains it in a non conducting state. This initially described state is maintained until sufficient volt-second product has been applied to the transformer to drive its core into saturation. When core saturation occurs, the transformer primary loses its ability to maintain a bias current sustaining voltage on the tertiary winding at which time this winding becomes essentially a short circuit. This applies a ground potential to the cathode of CR2 which quickly removes the stored charge from the emitter-base junction of Q2, causing it to turn off abruptly. With both transistors turned off, the magnetizing current in the transformer begins to flow out of the non polarity dot end of tertiary winding 104 into the base of Q1 via resistor R1. This turns Q1 on which initiates the second half cycle. This state will be maintained until the magnetic flux in the transformer core reaches saturation in the opposite sense, and the cycle repeats. The Royer oscillator thus continues to oscillate and produce symmetrical square waves on all its transformer windings as the saturable core is repeatedly driven from saturation to saturation. For the herein-described application, the two secondaries are used to provide steering signals of opposite phases to the two push-pull halves of the tandem version of the invention. These square wave signals are isolated from ground, so that virtual ground can be maintained continuously by the operational amplifier used in the invention. Transformer secondaries 120 and 150 produce complimentary square wave signals to provide the chopping excitation required to alternately refresh and linearize two identical current monitors, of the type herein described. Since the two current monitors are driven with opposite phase chopping signals, in a push-pull mode, a continuous current monitor output is realized.

The detailed operation is as follows. First with respect to the current monitor 117, the saturable transformer core 105 is driven into saturation, its refresh condition, by secondary 120 of transformer 122 when the polarity dot 121 is positive. Current flows from this positive end of the secondary 120 through a current limiting resistor 107, diode 109, diode 118 and returns to secondary 120. This applies a voltage across secondary 106 of transformer 103 that is of the same polarity as the voltage produced in primary 104 by current 101 in conductor 102. This drives saturable transformer core 105 into saturation to establish a baseline/refresh condition. When saturable transformer core 105 saturates, it becomes an effective short, so that the current previously flowing through diode 109 is diverted through secondary 106. This condition is maintained for the balance of the half cycle during which polarity dot 121 is positive.

When the chopping square wave polarity across winding 120 of transformer 122 reverses, current flows from this secondary through diode 119, diode 108, current limiting resistor 107, and returns to secondary 120. Since the anode of diode 108 is at ground potential, and this diode is conducting the above described current, it is evident that the cathode of this diode, and one end of the secondary 106 of the transformer 103, are at a potential of approximately minus 0.7 volts. The other end of secondary 106 is at virtual ground 129. This establishes a voltage across secondary 106 equal 0.7 volts and of such a polarity that it opposes the excitation produced by the current flowing the primary 104, i.e., the voltage applied to the secondary bucks that in the primary. This forces transformer core 105 out of saturation and causes it to operate as a linear current transformer. This second current path flows from the +15 volt supply 115 through the operational amplifier 111, resistor 110, secondary 106 of the transformer 103, current limiting resistor 107, secondary 120 of the transformer 122, diode 119 and returns to power supply 115 via the circuit ground. Since the current flowing in the secondary 106 is the primary current divided by the turns ratio, and since this same current flows through resistor 110, the voltage across resistor 110 is seen by Ohm's law to be in proportion to the current I. One end of the resistor 110 is at virtual ground 129 so that the output voltage is identically the voltage across resistor 110 and is proportional to the current I. Transformer 103 is wound on a core 105 that saturates and unsaturates abruptly. The transition from saturation, the reset condition, to linear operation occurs very quickly, typically a few microseconds.

The operation of the chopped current monitor 133 is identical to that of the chopped current monitor 117 described above. The chopped current monitors are operated in a push-pull phase relationship so that, when one is being refreshed, the other is delivering an output. The respective roles of the chopped current monitors are reversed during the next half cycle, so that a near continuous output is produced with slight perturbations, at the transitions of the chopping square waves produced by square wave generator 124. Capacitors 126 and 125 and resistor 123 smooth these imperfections to a degree that would be satisfactory for most applications.

In this embodiment of the invention, the square chopping voltages supplied by secondaries 120 and 150 are 6 volts peak and RMS. A typical square wave frequency is 2.0 KHz. Diodes 108, 109, 118, 119, 138, 139, 147 and 148 are type 1N4150. Resistors 107 and 137, are 120 ohm, ¼ watt. Capacitors 113 and 114 are 0.1 microfarad. With these parameters chosen, the gain of the current monitor output 116 divided by input 101 is 1.0 volt per amp over the useful range of zero to ten amps. A requirement for the design of the circuit is that the current through resistors 107 and 137 be greater than the maximum current through the resistor 110.

Figure 10:
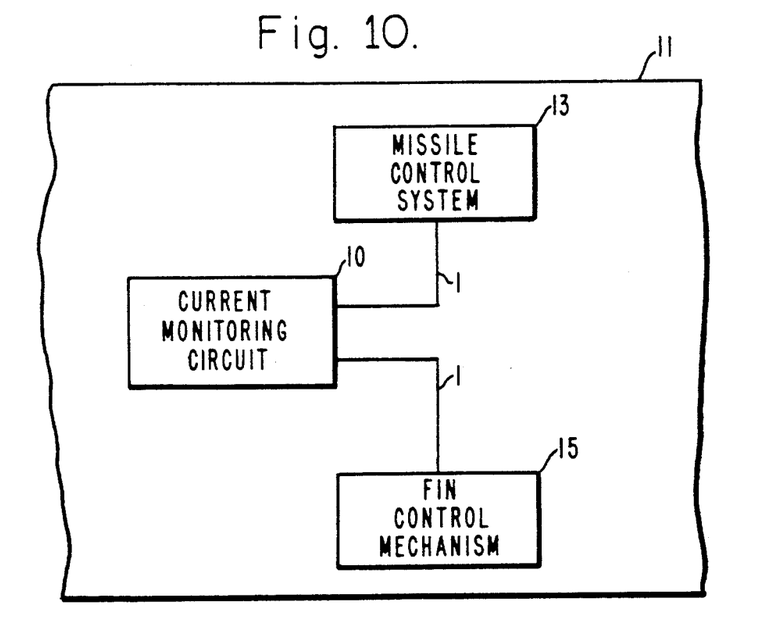
FIG. 10 shows the current monitoring circuit of the present invention adapted to monitor the current applied by a missile control system to a control mechanism for a fin of a missile.

Those skilled in the art will appreciate the utility of the present invention. For example, the present invention provides an improved missile control apparatus. That is, FIG. 10 shows the current monitoring circuit of the present invention 10 adapted to monitor the current applied by a missile control system 13 to a control mechanism 15 for a fin (not shown) of a missile 11 via the conductor 1.

Thus, the present invention has been described herein with reference to a particular embodiment for a particular application. The use of a very high permeability core material operates to assure that the error introduced by the magnetizing current is negligible for all but the most critical applications. The use of a very square hysteresis loop core material operates to assure that the minute magnetizing current is linear during the critical portions of the cycle. Compensating the error introduced by the minute linear magnetizing current is therefore accomplished simply, by a small increase, e.g., less than 1%, in the resistance of the operational amplifier feedback resistor.

Those having ordinary skill in the art and access to the present teachings will recognize additional modifications applications and embodiments within the scope thereof.

It is therefore intended by the appended claims to cover any and all such applications, modifications and embodiments within the scope of the present invention.

Accordingly,

What is claimed is:

1. An isolated current monitoring circuit for measuring direct and high duty factor current in a conductor comprising:

transformer means for magnetically sensing current flow in said conductor, said transformer means including a transformer having a primary winding connected electrically in series with said conductor and a secondary winding;

means, including an operational amplifier connected to said secondary winding, for driving said transformer into saturation during a first time interval;

biasing means for preventing the introduction of an error signal into said operational amplifier;

means for bringing said transformer out of saturation and operating said transformer as a current transformer during a second time interval; and means for providing an output signal, after the initiation of the second time interval, which is proportional to the flow of current in said conductor.

2. A circuit for monitoring the current applied to a control mechanism for a fin of a missile from a conductor including:

transformer means for magnetically sensing current flow in said conductor, said transformer means including a transformer having a primary winding connected electrically in series with said conductor and a secondary winding;

means, including an operational amplifier connected to said secondary winding, for driving said transformer into saturation during a first time interval;

biasing means for preventing the introduction of an error signal into said operational amplifier;

means for bringing said transformer out of saturation and operating said transformer as a current transformer during a second time interval; and means for providing an output signal, after the initiation of the second time interval, which is proportional to the flow of current in said conductor.

3. A method for measuring direct and high duty factor current in a conductor including the steps of:

a) magnetically sensing current flow in said conductor with a transformer having a primary winding connected electrically in series with said conductor;

b) driving said transformer into saturation during a first time interval with an operational amplifier;

c) preventing the introduction of an error signal into said operational amplifier;

d) bringing said transformer out of saturating and operating said transformer as a current transformer during a second time interval; and e) providing an output signal, after the initiation of the second time interval, which is proportional to the flow of current in said conductor.

* * * * *